(12) United States Patent
Harazono

(10) Patent No.: US 7,019,375 B2
(45) Date of Patent: Mar. 28, 2006

(54) SOLID-STATE IMAGING APPARATUS AND MANUFACTURING METHOD THEREOF

(75) Inventor: Fumikazu Harazono, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/104,365

(22) Filed: Apr. 12, 2005

(65) Prior Publication Data

US 2006/0017128 A1   Jan. 26, 2006

Related U.S. Application Data

(62) Division of application No. 10/306,956, filed on Nov. 29, 2002, now Pat. No. 6,949,808.

(30) Foreign Application Priority Data

Nov. 30, 2001 (JP) .............................. 2001-366981
Dec. 11, 2001 (JP) .............................. 2001-377018

(51) Int. Cl.
*H01L 27/14* (2006.01)
*H01L 31/0203* (2006.01)

(52) U.S. Cl. ...................... 257/433; 257/431; 257/432; 257/434; 438/64; 438/65

(58) Field of Classification Search ........ 257/431–434, 257/680, 698, 699, 737–738; 438/48, 64, 438/65; 361/736–737
See application file for complete search history.

(56) References Cited

U.S. PATENT DOCUMENTS

6,384,473 B1   5/2002   Peterson et al. ............. 257/680

FOREIGN PATENT DOCUMENTS

JP   2001-245186   9/2001

*Primary Examiner*—Donghee Kang
(74) *Attorney, Agent, or Firm*—Pearne & Gordon LLP

(57) ABSTRACT

A structure member is used wherein a circuit board is connected to a solid-state image pickup element and placed between a portion of the structure member to which the solid-state image pickup element is attached, and another portion to which a light-transmitting member is attached, and the circuit board is sealed integrally into the structure member. The solid-state image pickup element is attached to a through-opening portion 1C, and a light-transmitting member is attached so as to cover the through-opening portion 1C with being separated from the solid-state image pickup element by a predetermined distance. In a process of molding the structure member, the circuit board is integrally molded, whereby the manpower can be reduced, and the structures of the attaching portions can be simplified to miniaturize the device.

10 Claims, 9 Drawing Sheets

SOLID-STATE IMAGING APPARATUS AND MANUFACTURING METHOD THEREOF

BACKGROUND OF THE INVENTION

The present invention relates to a solid-state imaging apparatus and a manufacturing method thereof, and more particularly to a small-sized solid-state imaging apparatus including a solid-state image pickup element, such as a surveillance camera, a medical camera, or a vehicle camera, and a manufacturing method thereof.

An imaging apparatus of this kind receives an image through an optical system such as a lens, and outputs the image in the form of an electric signal. Recently, in accordance with miniaturization and enhancement of the performance of such an imaging apparatus, also the size of a camera is reduced, and an imaging apparatus is used in various fields and expands its market as an image inputting device.

In a conventional imaging apparatus using a solid-state image pickup element, each of components such as a lens, the solid-state image pickup element, and an LSI on which a driving circuit for the element and a signal processing circuit are mounted, has a shape of a case or a structure member, and the components are combined with each other. Conventionally, a mounting structure based on such a combination is formed by mounting elements onto a flat printed circuit board.

In order to further miniaturize such a device, a three-dimensional printed circuit board 201 shown in FIG. 11 was proposed in Japanese Patent Publication No. 2001-245186. The printed circuit board 201 is made of a resin in which a mounting member is configured by a leg portion 201A having a rectangular table-like shape, and a body portion 201B formed on the leg portion, and a through-opening portion 201C is formed in the interface between the leg portion 201A and the body portion 201B. A printed wiring pattern 205 is formed on the three-dimensional printed circuit board on side of the rear face of the leg portion 201A. A lens is fitted into the inner periphery of the body portion 201B. While being centered at the optical axis 217 of the lens, an optical filter 203 is placed above the through-opening portion 201C, and a solid-state image pickup element 204 and chip components 208 are placed below the through-opening portion. As shown in a section view of FIG. 12, the printed circuit board is connected by using solder 214 through the printed wiring pattern 205 formed on the leg portion 201A, to a main board 213 of an apparatus such as a portable telephone or a personal computer. On the main board 213, formed are a large number of components 219 including chip components such as a signal processing circuit (DSP) which processes an output signal of the solid state imaging element, resistors, and capacitors. Connections among the components are established by connecting the main board 213 to a flexible circuit board (FPC) 120 through a ball grid array (BGA) 221. FIG. 13 is a view showing main portions of the connections. The solid-state image pickup element 204 is connected to the printed wiring pattern 205 formed on the leg portion 201A, through bumps 206 formed on the surface of the image pickup element 204, and then sealed by a sealing resin 207 to accomplish the connections with the three-dimensional printed circuit board 201.

The identical portions are denoted by the identical reference numerals.

As apparent also from the figures, many components must be mounted and then connected to each other. Therefore, a conventional apparatus has problems in that many connections must be formed during a process of mounting components and hence the size of the apparatus is made large, and that the mounting process requires a prolonged time period.

In the mounting process, as shown in FIGS. 14A to 14C, a method is employed in which, after the three-dimensional printed circuit board 201 is molded (FIG. 14A), the solid-state image pickup element 204 is attached to the board (FIG. 14B), and the optical filter 203 is then attached (FIG. 14C).

In a heating step in the process of mounting the solid-state image pickup element 204 onto the three-dimensional printed circuit board 201, the three-dimensional printed circuit board 201 is largely deformed, and a very high stress is generated in connecting portions between the solid-state image pickup element 204 and the three-dimensional printed circuit board 201, so that a connection failure due to cracking often occurs.

Usually, such a three-dimensional printed circuit board is obtained by injection molding. However, there is a problem in that fillers, which are often used in order to reduce the coefficient of expansion of a resin material, cannot be added in an amount larger than a given one from the viewpoints of the molding accuracy and the durability of molding dies.

A thermoplastic resin usually used in injection molding has a straight-chain molecular structure, and hence exhibits anisotropic properties that the coefficient of linear expansion is small in the molecular bonding direction and large in a direction perpendicular to the bonding direction. In such a resin, fillers are oriented in the molding flow direction to exhibit further anisotropic properties that the coefficient is large in a direction perpendicular to the molding flow direction.

As described above, a conventional solid-state imaging apparatus is configured by externally attaching various function components such as a signal processing circuit, and hence has problems in that the mounting process requires a prolonged time period, and that the size of the device is large. Moreover, a connection failure occurs in connecting portions between a solid-state image pickup element and components of a processing circuit, and this causes the reliability to be lowered.

In a heating step in the process of mounting a solid-state image pickup element onto a three-dimensional printed circuit board, the three-dimensional printed circuit board is largely deformed, and a very high stress is generated in connecting portions between the solid-state image pickup element and the three-dimensional printed circuit board, so that a connection failure due to cracking often occurs.

Usually, such connecting portions between a solid-state image pickup element and a three-dimensional printed circuit board are configured by pads disposed on the solid-state image pickup element, and terminals of the three-dimensional printed circuit board. The connection between them is realized by connection using an electrically conductive adhesive agent such as silver paste, ultrasonic bonding, thermocompression bonding, or the like.

In any of the methods, the adhesion of the solid-state image pickup element is easily broken because of thermal deformation of the three-dimensional printed circuit board, and this causes the production yield to be lowered.

When a printed circuit board is three-dimensionally structured, miniaturization is enabled, but thermal distortion is larger than that in the case of a usual two-dimensional structure, thereby causing a large problem in that deformation due to the difference in coefficient of expansion blocks improvement of the yield.

It has been desired to provide a solid-state imaging apparatus which can be easily connected to an external processing circuit, and which can be further miniaturized.

SUMMARY OF THE INVENTION

The invention has been conducted in view of the circumstances. It is an object of the invention to provide a solid-state imaging apparatus in which a peripheral connection circuit is not required and the manufacturing process can be simplified, and which is small in size and highly reliable.

It is another object of the invention to suppress thermal deformation of a structure member such as a three-dimensional printed circuit board to ensure connection of a solid-state imaging apparatus and improve the bonding quality of the solid-state imaging apparatus.

According to the invention, a structure member into which a circuit board is integrally sealed is used, the circuit board being connected to a solid-state image pickup element and placed between a portion of a structure member to which the solid-state image pickup element is attached, and another portion to which a light-transmitting member is attached, the solid-state image pickup element is attached to a through-opening portion, and a light-transmitting member is attached so as to cover the through-opening portion with being separated from the solid-state image pickup element by a predetermined distance. In a process of molding the structure member, the circuit board is integrally molded, whereby the manpower can be reduced, and the structures of the attaching portions can be simplified, so that miniaturization of the device is realized.

According to the invention, a solid-state imaging apparatus comprises: a structure member which is configured by an insulating resin, and which has a through-opening portion; a solid-state image pickup element which is attached to the structure member to cover the through-opening portion; a light-transmitting member which is attached to the structure member to cover the through-opening portion with being separated from the solid-state image pickup element by a predetermined distance; and a circuit board which is connected to the solid-state image pickup element, and which is sealed integrally into the structure member to be placed between a portion of the structure member to which the solid-state image pickup element is attached, and another portion of the structure member to which the light-transmitting member is attached.

According to the configuration, the circuit board in which less thermal deformation is produced is sealed (into a peripheral portion) by using the thickness of an optical space between the portion to which the solid-state image pickup element is attached, and that to which the light-transmitting member is attached. Therefore, the number of external components can be largely reduced, and the device can be miniaturized. Since the circuit board is molded integrally with the structure member, thermal deformation of the structure member which occurs during a process of attaching the solid-state image pickup element can be greatly reduced, so that connection failures are largely decreased.

Preferably, the circuit board is a multilayer wiring board having a conductor pattern a part of which is exposed from the portion to which the solid-state image pickup element is attached, and the solid-state image pickup element is directly connected face-down to the conductor pattern of the circuit board.

According to the configuration, the number of external connections is decreased, and the device can be miniaturized and thinned by means of face-down connection.

Preferably, the circuit board includes a signal processing circuit which processes an output signal of the solid-state image pickup element.

According to the configuration, since the circuit board includes a signal processing circuit, it is not required to externally dispose the circuit, and hence miniaturization can be achieved. Moreover, the signal processing circuit is formed in close proximity to the solid-state image pickup element, so that the processing time can be shortened and the noise level can be lowered.

Preferably, the signal processing circuit is a chip component which is connected to a first face of the circuit board, the first face being on a side where the light-transmitting member is attached.

According to the configuration, since the signal processing circuit is mounted as a chip component on the multilayer wiring board, miniaturization can be achieved. Moreover, the signal processing circuit is formed in close proximity to the solid-state image pickup element, so that the processing time can be shortened and the noise level can be lowered.

Preferably, the circuit board is configured by an annular member including a part of a region corresponding to the through-opening portion, and comprising a through-hole to have a portion which protrudes into the through-opening portion and to which the light-transmitting member is attached, and the light-transmitting member is fixed to the portion of the circuit board to which the light-transmitting member is attached.

According to the configuration, since the light-transmitting member is attached onto the circuit board in which less thermal deformation is produced, thermal deformation can be further suppressed.

Preferably, the circuit board is configured by a multilayer wiring board, a conductor pattern is exposed also on a side of a face on which the solid-state image pickup element is mounted, and the solid-state image pickup element is directly connected to the conductor pattern.

According to the configuration, in the device, the connection is facilitated, and thinning and miniaturization can be further attained.

Preferably, the structure member has a leg portion, and a cylindrical body portion which is disposed on the leg portion, and the through-opening portion is placed between the body portion and the leg portion.

When this configuration is applied to a conventional device, the whole structure may be miniaturized, but there arises a problem in that a connection failure due to deformation of a connecting portion is easily caused by thermal deformation. By contrast, according to the invention, the solid-state image pickup element can be attached after the circuit board which is smaller in coefficient of thermal expansion than the insulating resin, and in which less thermal deformation is produced is attached by integral molding. Therefore, thermal deformation of the structure member made of the insulating resin can be suppressed, and the certainty of the connection of the solid-state image pickup element can be enhanced.

Preferably, the multilayer wiring board is electrically connected to a conductor pattern formed in a part of a surface of the leg portion.

According to the configuration, the device can be easily connected to an external device, and can be further miniaturized.

Preferably, the multilayer wiring board is configured by a material which is smaller in coefficient of thermal expansion than the insulating resin.

According to the configuration, since the multilayer wiring board has a coefficient of thermal expansion which is smaller than that of the insulating resin configuring the structure member, deformation which is produced by heat during a process of mounting the solid-state image pickup element can be reduced, so that the reliability can be improved.

Preferably, the light-transmitting member is configured by forming a dielectric thin film of a multilayer structure on a surface of quartz glass.

According to the configuration, since the coefficient of thermal expansion of quartz glass is smaller by one order than that of the resin configuring the structure member, deformation which is produced by heat during a process of mounting the solid-state image pickup element can be reduced, so that the reliability can be improved.

Preferably, the light-transmitting member is made of a thermosetting resin.

According to the configuration, since a thermosetting resin is used as the light-transmitting member, deformation which is produced by heat during a process of mounting the solid-state image pickup element can be reduced, so that the reliability can be improved.

Preferably, the light-transmitting member is an optical filter.

The position where the optical filter is attached determines the distance between the solid-state image pickup element and a lens which is attached in an outer position, and hence the attachment position is an important factor. According to the configuration, since the light-transmitting member is fixed by integral molding and configured by a member of a small coefficient of thermal expansion, deformation of the structure member is suppressed in the vicinity of the light-transmitting member. Therefore, thermal deformation of the structure member in the vicinity of the solid-state image pickup element can be suppressed, so that the certainty of the distance between the solid-state image pickup element and the optical filter is enhanced to enabling more excellent image capturing.

Preferably, the circuit board is configured by a multilayer wiring portion which is formed in an annular shape on a surface of a light-transmitting substrate, and a region which is positioned in a center area of the light-transmitting substrate, and which is exposed from the multilayer wiring portion constitutes the optical filter.

According to the configuration, the center area of the light-transmitting substrate constitutes the optical filter, the multilayer wiring portion is formed in the outer peripheral area of the substrate, and the circuit board and the optical filter are configured by the same substrate. Therefore, the number of components is further reduced, and miniaturization and thinning are enabled. Moreover, the number of mounting steps is further reduced, and the workability of a mounting process is improved.

Furthermore, according to the invention, a structure member which is formed by integrally sealing a circuit portion together with a fixing member is used, the circuit portion being connected to a solid-state image pickup element and formed on a flexible substrate so as to be placed between a portion of the structure member to which the solid-state image pickup element is attached, and another portion to which a light-transmitting member is attached, the solid-state image pickup element is attached to a through-opening portion, and a light-transmitting member is attached so as to cover the through-opening portion with being separated from the solid-state image pickup element by a predetermined distance. In a process of molding the structure member, the circuit portion formed on the flexible substrate is integrally molded together with the fixing member, whereby the manpower can be reduced, and the structures of the attaching portions can be simplified, so that miniaturization of the device is realized and the device is easily connected to an external device.

According to the invention, a solid-state imaging apparatus wherein the device comprises: a structure member which is configured by an insulating resin, and which has a through-opening portion; a solid-state image pickup element which is attached to the through-opening portion; and a light-transmitting member which is placed to cover the through-opening portion with being separated from the solid-state image pickup element by a predetermined distance, and a fixing member which is smaller in coefficient of thermal expansion than the insulating resin, a flexible substrate which is bonded to the fixing member, and a circuit portion which is formed on a surface of the flexible substrate, and on which desired function elements are mounted are integrally sealed into the structure member to be placed between a portion of the structure member to which the solid-state image pickup element is attached, and another portion of the structure member to which the light-transmitting member is attached.

According to the configuration, the circuit portion that is formed on the flexible substrate bonded to the fixing member in which less thermal deformation is produced is sealed (into a peripheral portion) by using the thickness of an optical space between the portion to which the solid-state image pickup element is attached, and that to which the light-transmitting member is attached. Therefore, the number of external components can be largely reduced, and the device can be miniaturized. Since the fixing member including the circuit portion is molded integrally with the structure member, thermal deformation of the structure member which occurs during a process of attaching the solid-state image pickup element can be greatly reduced, so that connection failures are largely decreased.

Preferably, the circuit portion has a multilayer wiring structure having a conductor pattern a part of which is exposed from the portion of the structure member to which the solid-state image pickup element is attached, and the solid-state image pickup element is directly connected face-down to the conductor pattern of the circuit portion.

According to the configuration, the number of external connections is decreased, and the device can be miniaturized and thinned by means of face-down connection.

Preferably, the circuit portion includes a signal processing circuit which processes an output signal of the solid-state image pickup element.

According to the configuration, since the circuit portion includes a signal processing circuit, it is not required to externally dispose the circuit, and hence miniaturization can be achieved. Moreover, the signal processing circuit is formed in close proximity to the solid-state image pickup element, so that the processing time can be shortened and the noise level can be lowered.

Preferably, the fixing member is an annular ceramic substrate having an opening in a region corresponding to the through-opening portion, and the signal processing circuit is a chip component which is connected to the circuit portion.

According to the configuration, since the ceramic substrate functions as the fixing member and the signal processing circuit is mounted as a chip component on the circuit portion, miniaturization can be achieved. Moreover, the signal processing circuit is formed in close proximity to the solid-state image pickup element, so that the processing time can be shortened and the noise level can be lowered.

Preferably, the chip component constituting the signal processing circuit is connected to a first face of the circuit portion, the first face being on a side where the light-transmitting member is attached, and connected to the circuit portion through through-holes formed in the ceramic substrate.

According to the configuration, connection of high reliability can be easily obtained, and the signal processing circuit can be formed in close proximity to the solid-state image pickup element, so that the processing time can be shortened and the noise level can be lowered.

Preferably, the circuit portion is configured by a multilayer wiring structure member, a conductor pattern is exposed also on a side of a face on which the solid-state image pickup element is mounted, and the solid-state image pickup element is directly connected to the conductor pattern.

According to the configuration, in the device, the connection is facilitated, and thinning and miniaturization can be further attained.

Preferably, the structure member has a leg portion on which a wiring portion is to be formed, and a cylindrical body portion which is disposed on the leg portion, and the through-opening portion is formed between the body portion and the leg portion.

When this configuration is applied to a conventional device, the whole structure may be miniaturized, but there arises a problem in that a connection failure due to deformation of a connecting portion is easily caused by thermal deformation. By contrast, according to the invention, the solid-state image pickup element can be attached after the circuit portion which is smaller in coefficient of thermal expansion than the insulating resin, and in which less thermal deformation is produced is attached by integral molding. Therefore, thermal deformation of the structure member made of the insulating resin can be suppressed, and the certainty of the connection of the solid-state image pickup element can be enhanced.

Preferably, the multilayer wiring structure member is electrically connected to a conductor pattern formed in a part of a surface of the leg portion.

According to the configuration, the device can be easily connected to an external device, and can be further miniaturized.

Preferably, the light-transmitting member is an optical filter.

The position where the optical filter is attached determines the distance between the solid-state image pickup element and a lens which is attached in an outer position, and hence the attachment position is an important factor. According to the configuration, since the light-transmitting member is fixed by integral molding and configured by a member of a small coefficient of thermal expansion, deformation of the structure member is suppressed in the vicinity of the light-transmitting member. Therefore, thermal deformation of the structure member in the vicinity of the solid-state image pickup element can be suppressed, so that the certainty of the distance between the solid-state image pickup element and the optical filter is enhanced to enabling more excellent image capturing.

Preferably, the flexible substrate has an extended portion having a conductor terminal pattern which elongates toward an outside of the structure member, and the conductor terminal pattern constitutes power source and output terminals for the signal processing circuit.

According to the configuration, a film carrier can be elongated out together with a wiring pattern to the outside of the structure member, and connected as it is to external components. Therefore, the device can be mounted as it is to a foldable portable telephone or the like, so that miniaturization can be attained in a large degree.

According to the method of the invention, the method comprises: a wiring board forming step of preparing an insulating board having a through-hole in a center area, and forming wiring layers to form a circuit board; a step of connecting a signal processing circuit chip onto a first surface of the circuit board; a structure member molding step of conducting a sealing process by an insulating resin to cover the circuit portion in which the signal processing circuit is formed, and form a through-opening portion in a region corresponding to the through-hole, thereby forming a structure member; a solid-state image pickup element attaching step of attaching a solid-state image pickup element onto a second surface of the circuit board to cover the through-opening portion of the structure member; and a light-transmitting member attaching step of attaching a light-transmitting member onto the first face of the circuit board.

According to the configuration, since the circuit board of less thermal deformation is molded integrally with the structure member, thermal deformation of the structure member which occurs during a process of attaching the solid-state image pickup element is greatly reduced, so that connection failures are largely decreased. A step of attaching the light-transmitting member is not required, and hence the productivity can be improved. Also a margin which is necessary for such attachment is not required, and hence the device can be miniaturized.

Preferably, the structure member molding step is an injection molding step of forming the structure member made of a thermoplastic insulating resin by injection molding.

When such a structure member is made of a thermoplastic resin and formed by injection molding, deformation is easily produced particularly during a hardening process, and deformation is produced also when a device is used in a high temperature environment, thereby causing a problem in that a connection failure easily occurs in a portion where the solid-state image pickup element is connected to the structure member (three-dimensional printed circuit board). By contrast, according to the configuration, thermal deformation of the structure member made of the insulating resin is suppressed by the circuit board in which the coefficient of thermal expansion is smaller than that of the insulating resin and hence less thermal deformation is produced, so that the certainty of the connection of the solid-state image pickup element can be enhanced.

Further, according to the method of the invention, the method comprises: a board forming step of preparing a flexible substrate having a penetrated hole in a center area, forming wiring layers to constitute a circuit portion, and bonding the flexible substrate to a fixing member; a step of forming a signal processing circuit in the circuit portion; a structure member molding step of conducting a sealing process by an insulating resin to cover the circuit portion in which the signal processing circuit is formed, and form a through-opening portion in a region corresponding to the penetrated hole, thereby forming a structure member; a solid-state image pickup element attaching step of attaching a solid-state image pickup element to be electrically connected to the circuit portion and cover the through-opening portion of the structure member; and a light-transmitting member attaching step of attaching a light-transmitting member onto a first face of the circuit portion.

According to the configuration, since the flexible substrate on which the circuit portion is formed is bonded to the fixing member of less thermal deformation to function also as the signal processing circuit and a support portion, and these members are molded integrally with the structure member, thermal deformation of the structure member which occurs during a process of attaching the solid-state image pickup element is greatly reduced, so that connection failures are largely decreased. A step of attaching chip components and the like is not required, and hence the productivity can be improved. Also a margin which is necessary for such attachment is not required, and hence the device can be miniaturized.

Preferably, the structure member molding step is an injection molding step of forming the structure member made of a thermoplastic insulating resin by injection molding.

When such a structure member is made of a thermoplastic resin and formed by injection molding, deformation is easily produced particularly during a hardening process, and deformation is produced also when a device is used in a high temperature environment, thereby causing a problem in that a connection failure easily occurs in a portion where the solid-state image pickup element is connected to the structure member (three-dimensional printed circuit board). By contrast, according to the configuration, thermal deformation of the structure member made of the insulating resin is suppressed by the circuit portion in which the coefficient of thermal expansion is smaller than that of the insulating resin and hence less thermal deformation is produced, so that the certainty of the connection of the solid-state image pickup element can be enhanced.

DETAILED DESCRIPTION OF THE PREFERRED EMBODIMENT

Hereinafter, embodiments of the invention will be described in detail with reference to the accompanying drawings.

(Embodiment 1)

Figure 1:
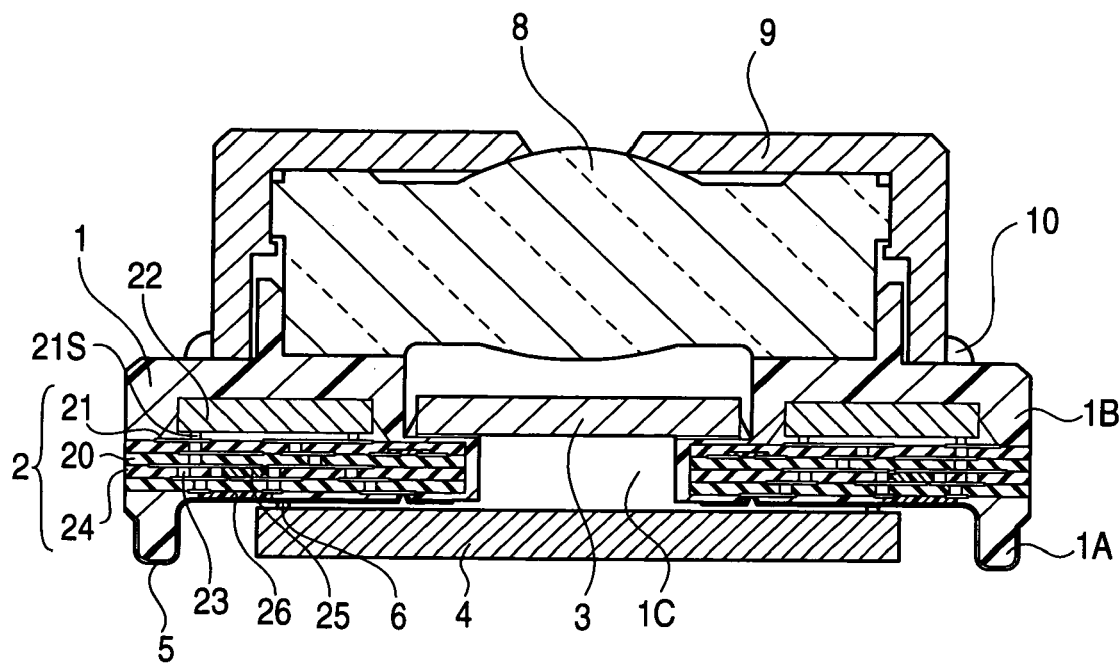
FIG. 1 is a section view showing a solid-state imaging apparatus of a first embodiment of the invention.
Figure 2:
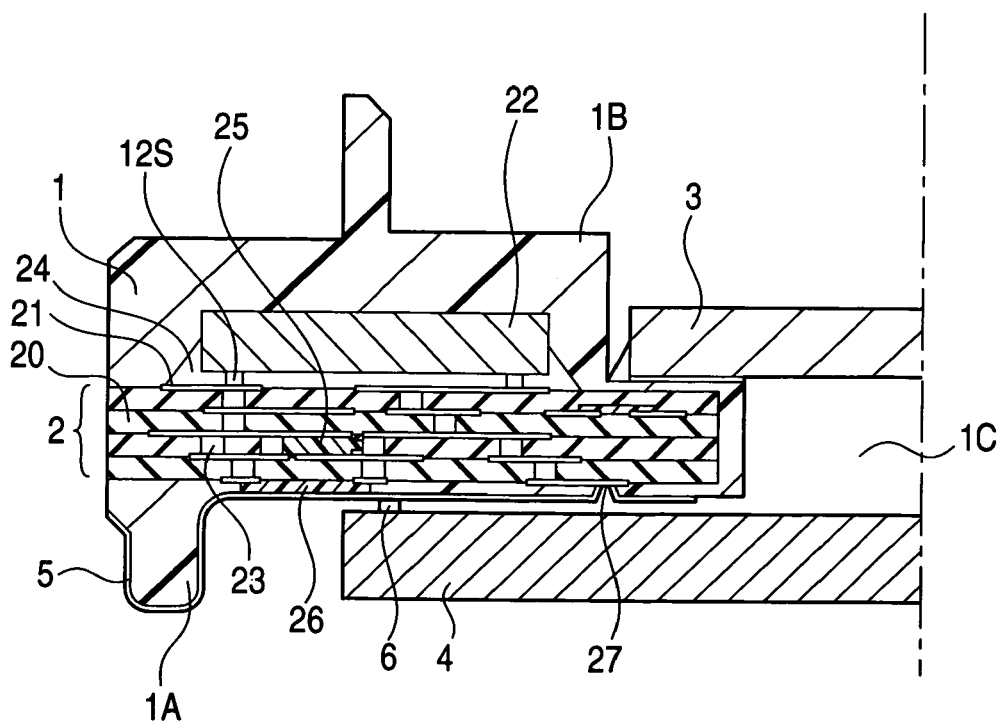
FIG. 2 is an enlarged section view showing main portions of the solid-state imaging apparatus of the first embodiment of the invention.

FIGS. 1 and 2 are views showing main portions of a solid-state imaging apparatus which is a first embodiment of the invention.

In the solid-state imaging apparatus, in a molding process of a structure member 1 on which a solid-state image pickup element is to be mounted, a multilayer wiring board 2 is sealed together with a signal processing circuit chip DSP 22 formed on a first face of the multilayer wiring board 2, into the structure member 1 configured by an insulating polyphthalamide resin. Incidentally, the multiplayer wiring board serves as a serving circuit board formed a ceramic substrate as a basic member, and the coefficient of thermal expansion of the ceramic substrate is very smaller than that of a resin constituting the structure member. The structure member 1 has a through-opening portion 1C. A plate-like member constituting an optical filter 3 is attached to the structure member 1, includes the signal processing circuit chip DSP 22 therein, above the first face of the multilayer wiring board 2, so as to face the through-opening portion 1C. A solid-state image pickup element 4 is attached in a face-down manner to a second face of the multilayer wiring board 2. In the embodiment, the optical filter 3 is configured by a quartz refraction plate, and a peripheral portion of the filter is fixed to the structure member 1 by an adhesive agent.

The multiplayer wiring board 2 may be exposed from a surface of the through-hole opening portion 1C and/or a region where the optical filter is disposed of the structure member. In this case, the optical filter is fixed on the multiplayer wiring board 2.

The solid-state imaging apparatus includes the structure member 1 and a solid-state image pickup element 4. The structure member 1 is made of an insulating polyphthalamide resin and includes a leg portion 1A having a rectangular table-like shape, a body portion 1B formed on the leg portion 1A, a through-opening portion 1C formed in the interface between the leg portion 1A and the body portion 1B. The structure member 1 further includes a wiring portion which has the multilayer wiring board 2 in the vicinity of a portion where the optical filter 3 is attached, and which includes a terminal pattern 5 in a part of the surface of the leg portion 1A. In the multilayer wiring board 2, an inner edge is partly projected in a direction of the through-opening portion 1C, and at least one hole is formed. The solid-state image pickup element 4 is connected to the wiring portion attached to the through-opening portion 1C, and electrically connected to the terminal pattern 5 through via holes 27.

The multilayer wiring board 2 is configured by forming multilayer films of copper wiring patterns 21 and polyimide resin films 24 on a first face (front face) and a second face (rear face) of a ceramic substrate 20, respectively. The copper wiring patterns 21 in the layers are connected to one another through via holes 23 formed in the polyimide resin films 24. Also elements such as thin film capacitors 25 and thin film resistors 26 are formed on the multilayer wiring board.

Next, a method of manufacturing the solid-state imaging apparatus of the first embodiment will be described.

Figure 3A:
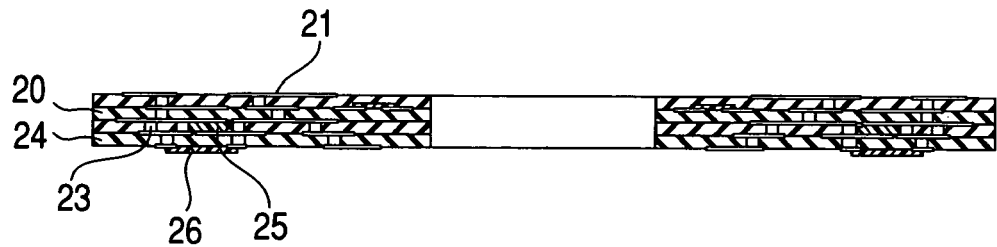
FIGS. 3A to 3D are views showing steps of manufacturing the solid-state imaging apparatus of the first embodiment of the invention.

As shown in FIG. 3A, first, a copper thin film is formed on the first (front) and second (rear) faces of the ceramic substrate 20, the copper thin film is patterned by the photolithography technique to form a wiring pattern 21, a polyimide resin film 24 is then applied, and via holes 23 are formed. Subsequently, the step of forming a copper thin film, and conducting the patterning process by the photolithography technique to form the wiring patterns 21 is repeatedly performed to form the multilayer wiring board 2 having a desired pattern. During the pattern forming step, a resistor thin film is laminated and sandwiched between the wiring patterns to form the thin film capacitors, resistor thin films are placed between the wiring patterns to form the thin film resistors, and as required chip components are connected.

Figure 3B:
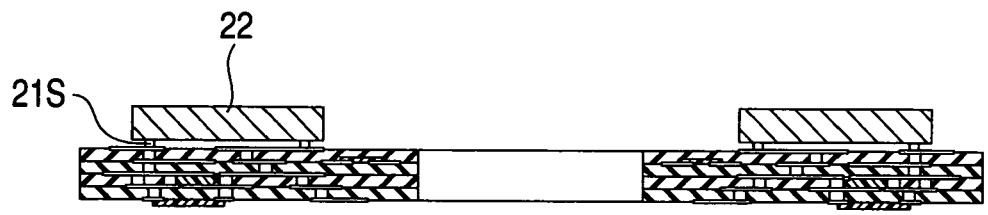

As shown in FIG. 3B, thereafter, the signal processing circuit chip DSP 22 is directly connected to bumps 21S formed on the wiring patterns 21 on the front face of the substrate.

Figure 3C:
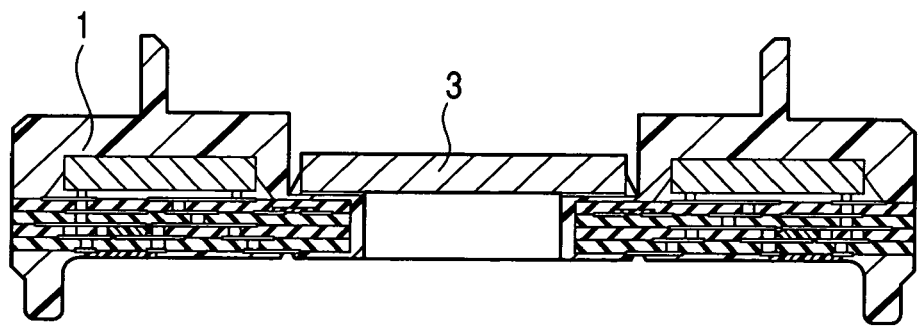

The thus formed multilayer wiring board 2 is placed in molding dies. As shown in FIG. 3C, a polyphthalamide resin is injected into a cavity formed in the molding dies, and then cooled and cured, thereby forming the structure member 1 made of a polyphthalamide resin, configured by the leg portion 1A having a rectangular table-like shape, and the body portion 1B provided on the leg portion, and having the through-opening portion 1C which disposed in the interface between the leg portion 1A and the body portion 1B.

On the other hand, a dielectric thin film of a multilayer structure having a desired refractive index is vapor-deposited onto the surface of a quartz plate to form the optical filter 3 configured by a dielectric interference filter.

As shown in FIG. 3C, thereafter, the optical filter 3 is bonded to the first face of the multilayer wiring board 2 which is exposed from the structure member 1 so as to face the through-opening portion 1C.

Then, the wiring portion including the terminal pattern 5 formed on the rear face of the leg portion 1A is formed in a predetermined area of the structure member 1 by a plating process or a thin film process such as the sputtering technique.

Figure 3D:
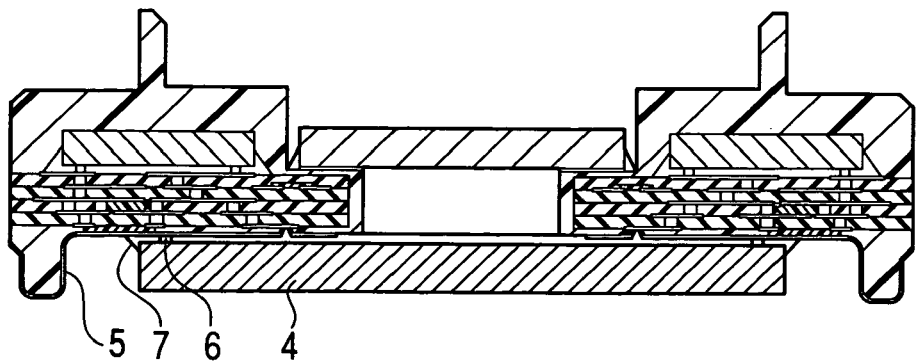

As shown in FIG. 3D, thereafter, the solid-state image pickup element (chip) 4 is mounted onto one face of the through-opening portion of the structure member 1. Bumps 6 are previously formed on contact terminals of the solid-state image pickup element 4, and the terminals are connected by thermocompression bonding to ends of the terminal patterns formed on the leg portion 1A of the structure member 1. Then, a resin sealing process is conducted to cover the surface of the solid-state image pickup element 4 by a resin sealing member 7.

Finally, a lens 8 is covered by a shield case 9, and connected to the structure member 1 by an adhesive resin 10 to form the solid-state imaging apparatus shown in FIGS. 1 and 2.

In the thus formed solid-state imaging apparatus, the multilayer wiring board on which the chip components such as the DSP are mounted and in which the thin film resistors, the thin film capacitors and the like are mounted, is sealed into the structure member made of the insulating resin. Therefore, the device has a very small size, can be easily produced, and is highly reliable.

The structure member 1 made of the insulating resin is supported by the multilayer wiring board sealed in the structure member. During the process of mounting the solid-state image pickup element, therefore, the multilayer wiring board which is smaller in coefficient of thermal expansion than the structure member functions as a fixing member to suppress thermal deformation of the structure member, with the result that the certainty of the connection of the solid-state image pickup element can be enhanced.

Moreover, mounting of the peripheral circuit components such as the signal processing circuit is not required. The device is configured as a so-called hybrid IC, and such components are placed by using the optical space which is formed between the optical filter and the solid-state image pickup element. Therefore, a large size reduction of the device can be attained.

The step of mounting such components is not required. Consequently, the number of mounting steps can be greatly reduced, and the workability is improved.

The structure member is obtained by injection molding. A polyphthalamide resin has a straight-chain molecular structure, and hence exhibits anisotropic properties that the coefficient of thermal expansion is small in the molecular bonding direction and large in a direction perpendicular to the bonding direction. In the first embodiment, therefore, the annular multilayer wiring board is sealed so as to surround the through-opening portion. Alternatively, two multilayer wiring boards may be sealed in parallel along the injection direction of a thermoplastic resin, and in positions which are opposed to each other across the through-opening portion. In the alternative also, it is possible to suppress the elongation in a direction perpendicular to the molecular bonding direction.

In the first embodiment, preferably, a hole communicating with the through-opening portion is formed in order to discharge a gas generated during the process of attaching the solid-state image pickup element, by, for example, forming a penetrated hole in the vicinity of the portion where the optical filter is embedded.

In the formation of the multilayer wiring board, the via holes may be formed in the substrate or insulating films by forming holes by a laser processing and then conducting a sputtering process, a plating process, or the like.

The whole surface of the structure member may be plated in a last step, and the surface plating layer may be connected to a grounding terminal of the multilayer wiring board to form an electromagnetic shield.

(Embodiment 2)

Figure 4:
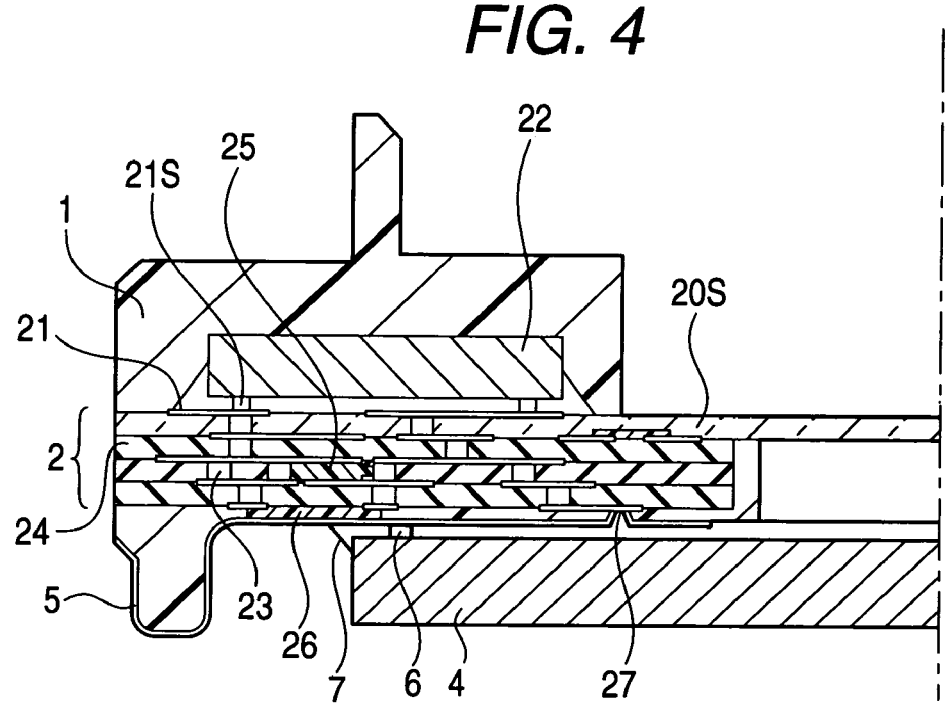
FIG. 4 is a section view showing main portions of a solid-state imaging apparatus of a second embodiment of the invention.

FIG. 4 is a view showing main portions of a solid-state imaging apparatus according to a second embodiment of the invention.

In the first embodiment, the optical filter 3 is attached to the multilayer wiring board. In contrast, according to the second embodiment, the ceramic substrate constituting the multilayer wiring board is made of light-transmitting ceramic, and a desired film is formed on the surface as a multi-refraction material 20S which will be used as an optical filter. The multilayer wiring board which is to be sealed into the structure member is configured in the following manner. The multi-refraction material 20S is used as an insulating substrate, and a multilayer wiring structure member 2M is formed so as to have an annular shape in a peripheral area excluding the area corresponding to the through-opening portion 1C. The multilayer wiring structure member 2M is placed in molding dies, and then injection molding is conducted to seal a center area of the multilayer wiring structure member 2M by a structure member made of a polyphthalamide resin.

According to the manufacturing process of the embodiment, in the molding of the structure member 1 on which the solid-state image pickup element 4 is to be mounted, a plate-like member in which many multilayer wiring structure members 2M are integrally formed is formed, and many structure members are integrally molded together with the plate-like member, so that the molded product can be then diced into individual solid-state imaging apparatuses.

In the embodiment, in order to discharge an internal gas generated during the process of mounting the solid-state image pickup element, a penetrated hole communicating with the through-opening portion 1C is preferably formed in the center area which will be used as an optical filter. The other portions are formed in the same manner as those of the first embodiment.

Figure 5:
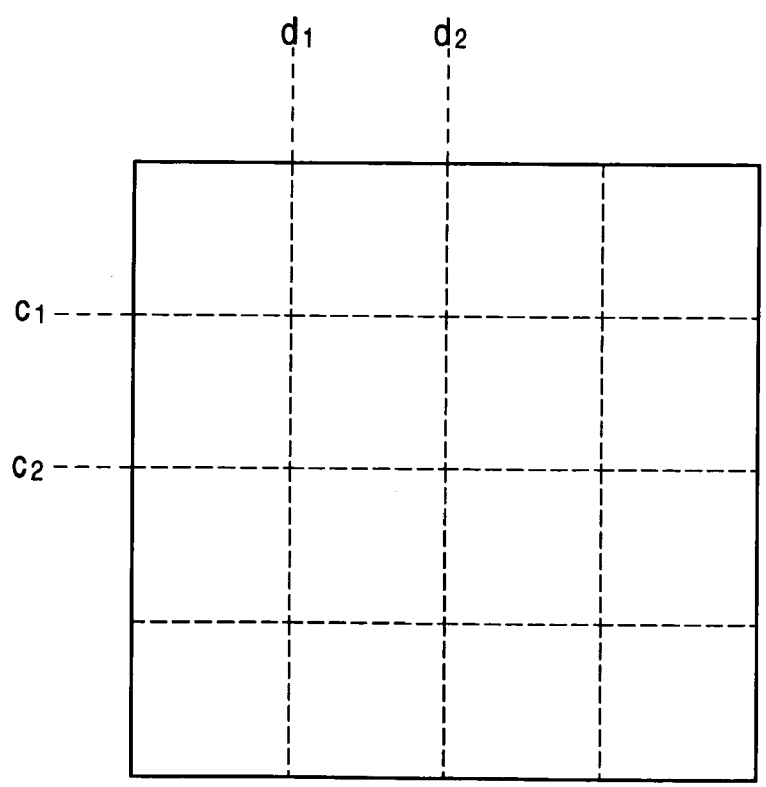
FIG. 5 is a view showing part of steps of manufacturing the solid state imaging device of the second and fourth embodiments of the invention.

In the manufacturing process, the device of the embodiment is formed in a similar manner as the first embodiment. In the embodiment, however, not only the optical filters but also structure members are integrally molded, and the molded product is finally diced along dicing lines d1, d2, d3, . . . , c1, c2, c3, . . . as shown in FIG. 5, thereby obtaining the solid-state imaging apparatus shown in FIG. 4.

(Embodiment 3)

Figure 6:
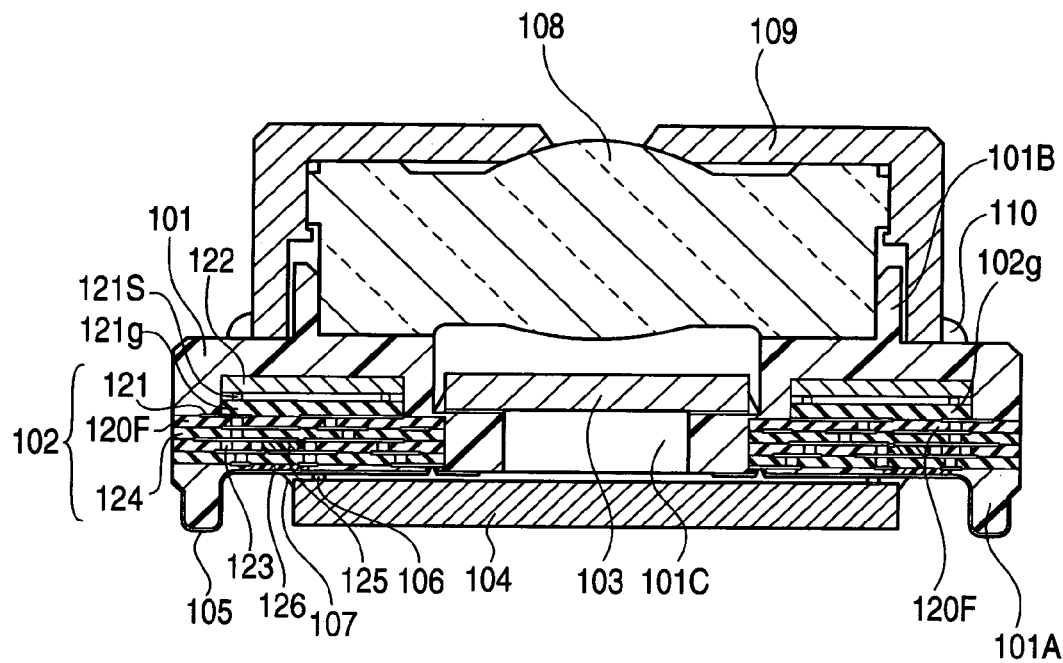
FIG. 6 is a section view showing a solid-state imaging apparatus of a third embodiment of the invention.
Figure 7:
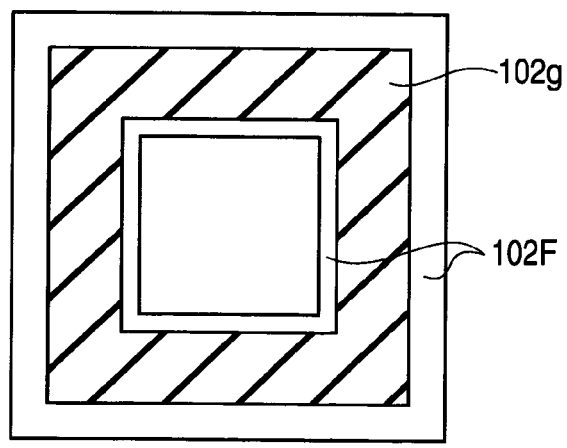
FIG. 7 is a section view showing the solid-state imaging apparatus of the third embodiment of the invention.

FIGS. 6 and 7 are views showing main portions of a solid-state imaging apparatus according to a third embodiment of the invention. FIG. 7 is a section view taken along the line A—A in FIG. 6.

In the solid-state imaging apparatus, in a molding process of a structure member 101 on which a solid-state image pickup element 104 is to be mounted, a ceramic substrate 102g and a circuit portion 102 of a multilayer wiring structure formed on a film carrier 120F serving as a flexible substrate are sealed together with a signal processing circuit chip (DSP) 122 formed on a first face of the ceramic substrate 102g via through-holes (not shown) opened in the ceramic substrate 102g, into the structure member 101 configured by an insulating polyphthalamide resin. Incidentally, the ceramic substrate 102g is used as a fixing member, and the coefficient of thermal expansion of the ceramic substrate 102g is very smaller than that of a polyphthalamide resin constituting the structure member 101. The structure member 101 includes a through-opening portion 101C. A plate-like member constituting an optical filter 103 is attached to the structure member 101 including the signal processing circuit chip (DSP) 122 sealed inside thereof on the first face of the ceramic substrate 102g to which the circuit portion 102 is fixed, so as to face the through-opening portion 101C. A solid-state image pickup element 104 is attached in a face-down manner to a second face of the ceramic substrate. In the embodiment, the optical filter 103 is configured by a quartz refraction plate, and a peripheral portion of the optical filter 103 is fixed to the structure member 101 by an adhesive agent.

The circuit portion 102 may be exposed from a surface of the through-hole opening portion 1C and/or a region where the optical filter is disposed of the structure member. In this case, the optical filter is fixed on the circuit portion 102.

The solid-state imaging apparatus includes the structure member 101 and a solid-state image pickup element 104. The structure member is made of an insulating polyphthalamide resin and including a leg portion 101A having a rectangular table-like shape, and a body portion 101B provided on the leg portion, and a through-opening portion 101C provided in the interface between the leg portion 101A and the body portion 101B. The structure member further includes a wiring portion having the circuit portion 102 in the vicinity of a portion where the optical filter 103 is attached, and which includes a terminal pattern 105 in a part of the surface of the leg portion 101A. The circuit portion 102 is formed on the flexible substrate, and an inner edge thereof is partly extended in a direction of the through-opening portion 101C, have at least one hole. The solid-state image pickup element 104 is connected to the wiring portion, attached to the through-opening portion 101C, and electrically connected to the terminal pattern 105 through via holes.

The circuit portion 102 is configured by bonding a first face (front face) of the film carrier 120F of a polyimide film having an opening in a center area, to the ceramic substrate 102g, and forming multilayer films of copper wiring patterns 121 and polyimide resin films 124 on a second face (rear face). The copper wiring patterns in the layers are connected to one another through via holes 123 formed in the polyimide resin films 124. Also elements such as thin film capacitors 125 and thin film resistors 126 are formed on the circuit portion 102.

Next, a method of manufacturing the solid-state imaging apparatus will be described.

Figure 8A:
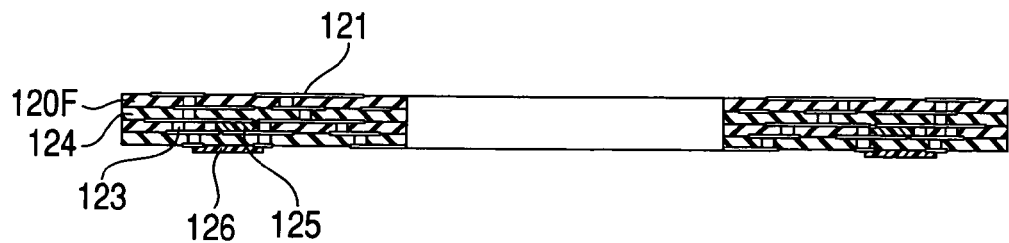
FIGS. 8A to 8D are views showing steps of manufacturing the solid-state imaging apparatus of the third embodiment of the invention.

As shown in FIG. 8A, first, a copper thin film is formed on the second (rear) face of the film carrier 120F of a polyimide film, the copper thin film is patterned by the photolithography technique to form the wiring pattern 121, the polyimide resin film 124 is then applied, and the via holes 123 are formed. The step of forming a copper thin film, and conducting the patterning process by the photolithography technique to form the wiring patterns 121 is repeatedly performed to form the circuit portion 102 of the multilayer wiring structure having a desired pattern. During the pattern forming step, a resistor thin film is laminated and sandwiched between the wiring patterns to form the thin film capacitors, resistor thin films are placed between the wiring patterns to form the thin film resistors, and as required chip components are connected.

Figure 8B:
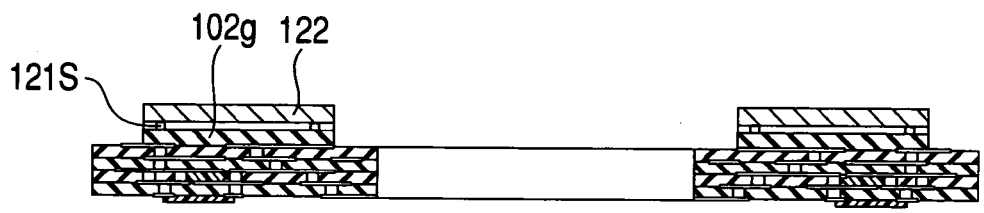

As shown in FIG. 8B, thereafter, through-holes are formed so as to be formed in the wiring pattern 121 of the surface of the substrate, the ceramic substrate 102g which has the wiring pattern and bumps 121S on the surface is bonded, and the signal processing circuit chip (DSP) 122 is directly connected to the bumps 121S on the ceramic substrate. The signal processing circuit chip 122 is connected from the surface side of the ceramic substrate 102g to the circuit portion through the through-holes, and through-holes formed in the film carrier.

Figure 8C:
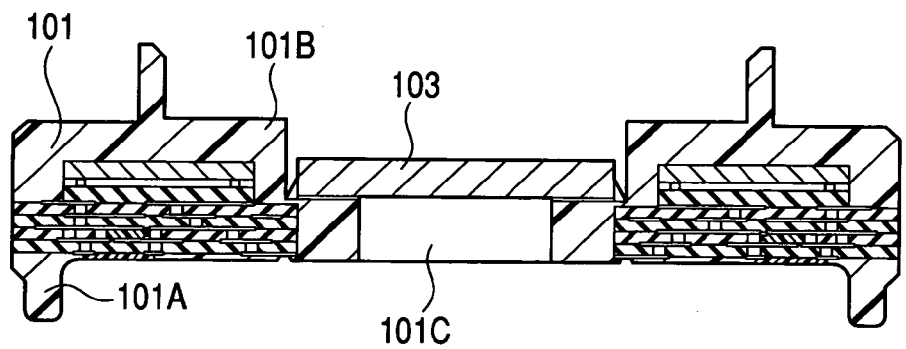

The thus formed circuit portion 102 is placed in molding dies, together with the ceramic substrate 102g serving as the fixing member. As shown in FIG. 8C, a polyphthalamide resin is injected into a cavity formed in the molding dies, and then cooled and cured, thereby forming the structure member 101 made of a polyphthalamide resin, configured by the leg portion 101A which has a rectangular table-like shape, and the body portion 101B which is provided on the leg portion, and having the through-opening portion 101C which is formed in the interface between the leg portion 101A and the body portion 101B.

On the other hand, a dielectric thin film of a multilayer structure having a desired refractive index is vapor-deposited onto the surface of a quartz plate to form the optical filter 103 configured by a dielectric interference filter.

The optical filter 103 is then bonded to the first face of the circuit portion 102 which is exposed from the structure member 101 so as to face the through-opening portion 101C.

Then, the wiring portion including the terminal pattern 105 formed on the rear face of the leg portion 101A is formed in a predetermined area of the structure member by a plating process or a thin film process such as the sputtering technique.

Figure 8D:
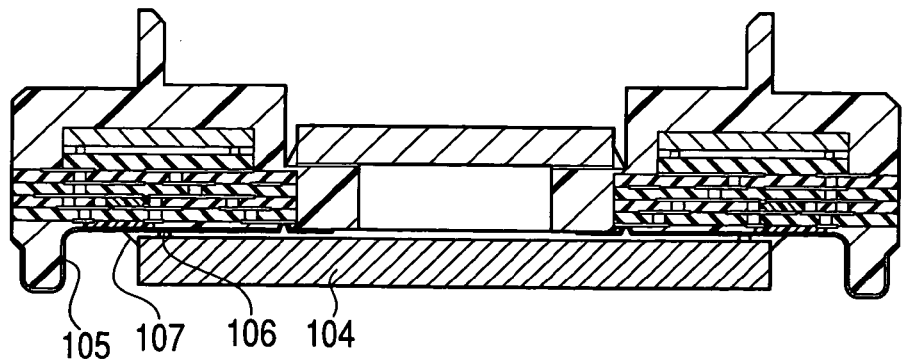

As shown in FIG. 8D, thereafter, the solid-state image pickup element (chip) 104 is mounted onto one face of the through-opening portion 1C of the structure member 101. Bumps 106 are previously formed on contact terminals of the solid-state image pickup element 104, and the terminals are connected by thermocompression bonding to ends of the terminal patterns formed on the leg portion 101A of the structure member. Then, a resin sealing process is conducted to cover the surface of the solid-state image pickup element 104 by a resin sealing member 7.

Finally, a lens 108 is covered by a shield case 109, and connected to the structure member 101 by an adhesive resin 110 to form the solid-state imaging apparatus of the third embodiment shown in FIGS. 6 and 7.

In the thus formed solid-state imaging apparatus, the multilayer wiring board on which the chip components such as the DSP are mounted and also the thin film resistors, the thin film capacitors, and the like are mounted is sealed into the structure member made of the insulating resin. Therefore, the device has a very small size, can be easily manufactured, and is highly reliable.

The structure member made of the insulating resin is supported by the ceramic substrate 2g sealed in the structure member. During the process of mounting the solid-state image pickup element, therefore, the ceramic substrate which is smaller in coefficient of thermal expansion than the structure member functions as a fixing member to suppress thermal deformation of the structure member, with the result that the certainty of the connection of the solid-state image pickup element can be enhanced.

Since the peripheral circuit components such as the signal processing circuit are formed on the film carrier bonded to the ceramic substrate, the device is configured as a so-called hybrid IC, and such components are placed by using the optical space which is formed between the optical filter and the solid-state image pickup element. Therefore, a large reduction of the size of the device can be attained.

The step of mounting such components is not required. Consequently, the number of mounting steps can be greatly reduced, and the workability is improved.

The structure member is obtained by injection molding. A polyphthalamide resin has a straight-chain molecular structure, and hence exhibits anisotropic properties that the coefficient of thermal expansion is small in the molecular bonding direction and large in a direction perpendicular to the bonding direction. In the third embodiment, therefore, the annular multilayer wiring board is sealed so as to surround the through-opening portion. Alternatively, two ceramic substrates may be formed and bonded to a film carrier in parallel along the injection direction of a thermoplastic resin, and in positions which are opposed to each other across the through-opening portion. In the alternative also, it is possible to suppress the elongation in a direction perpendicular to the molecular bonding direction.

In the third embodiment, preferably, a hole communicating with the through-opening portion in order to discharge a gas generated during the process of attaching the solid-state image pickup element, by, for example, forming a penetrated hole in the vicinity of the portion where the optical filter is embedded.

In the formation of the ceramic substrate and the circuit portion, the via holes may be formed in the substrate or insulating films by forming holes by a laser processing and then conducting a sputtering process, a plating process, or the like.

The whole surface of the structure member may be plated in a last step, and the surface plating layer may be connected to a grounding terminal of the multilayer wiring board to form an electromagnetic shield.

(Embodiment 4)

Figure 9:
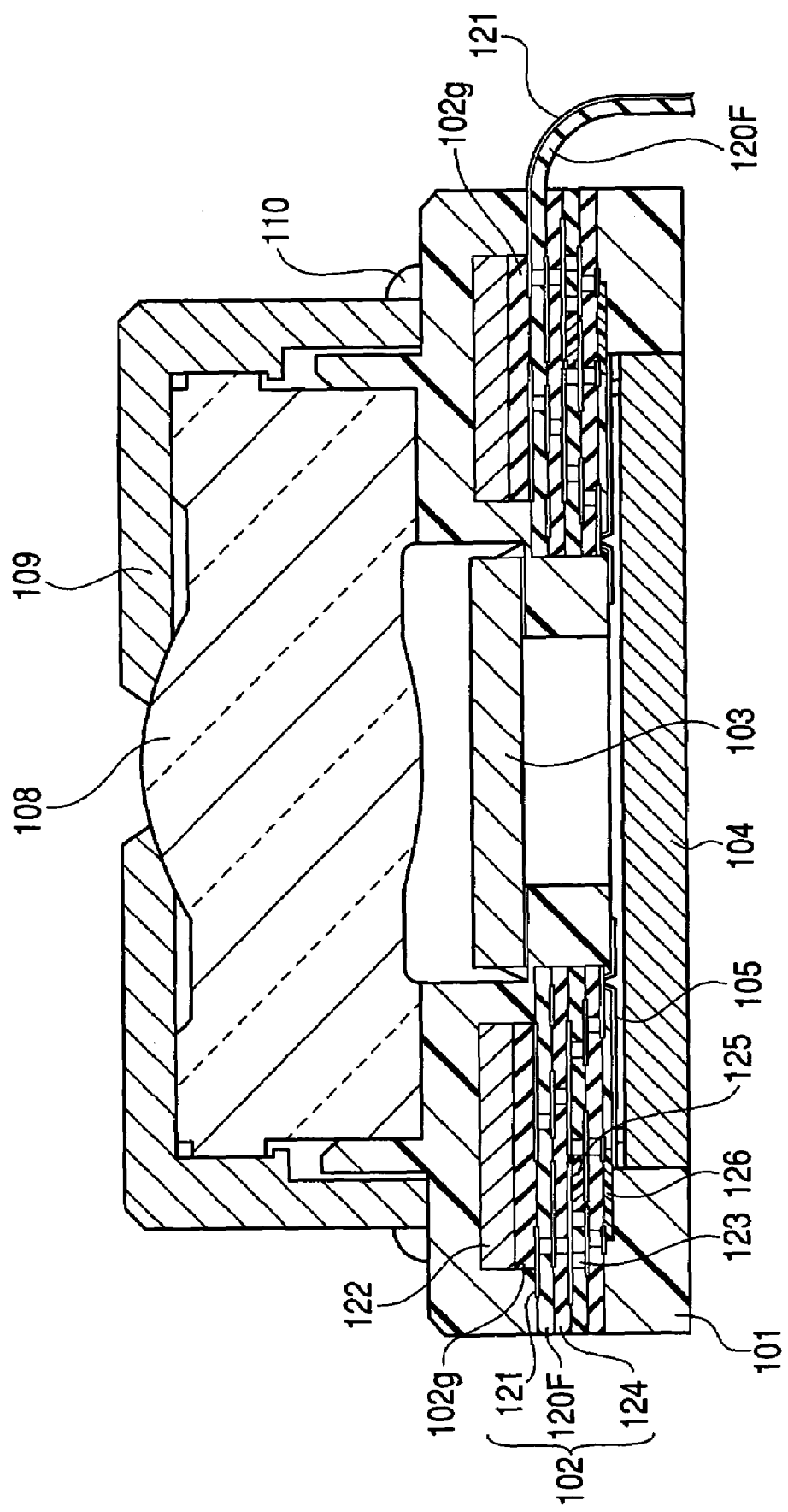
FIG. 9 is a section view showing a solid-state imaging apparatus of a fourth embodiment of the invention.
Figure 10:
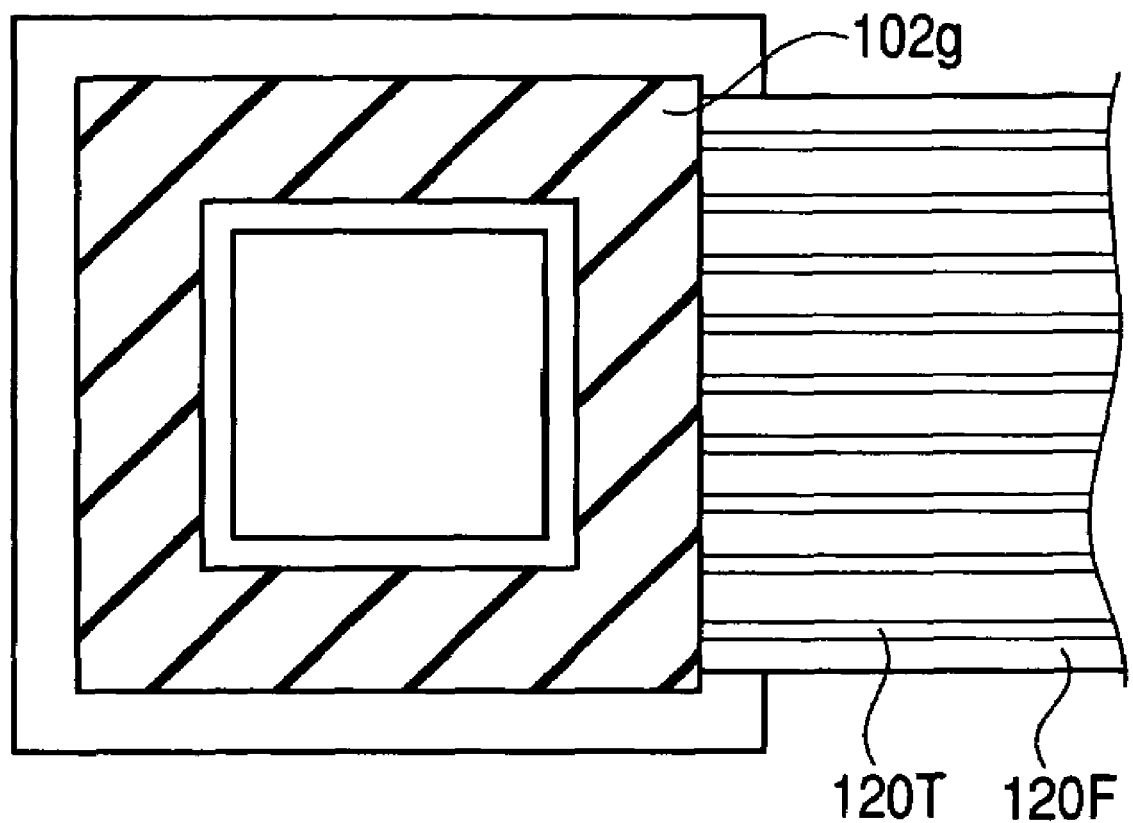
FIG. 10 is a plan view showing main portions of the solid-state imaging apparatus of the second embodiment of the invention.
Figure 11:
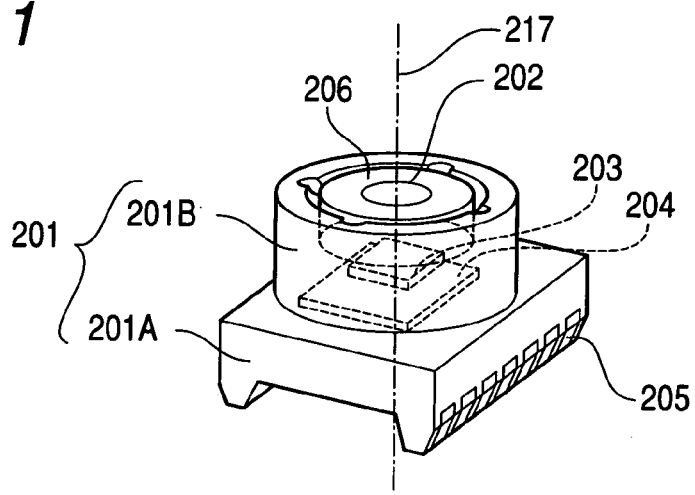
FIG. 11 is a perspective view showing a conventional solid-state imaging apparatus.
Figure 12:
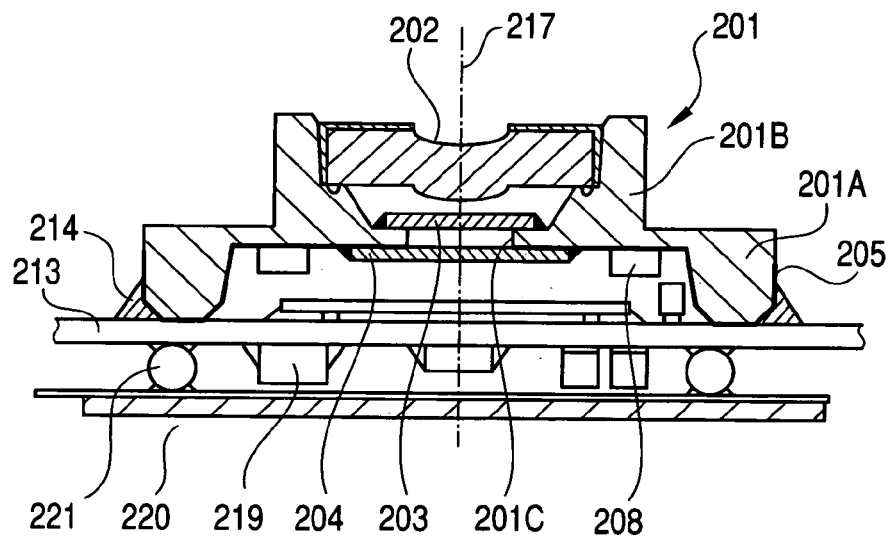
FIG. 12 is a section view showing the conventional solid-state imaging apparatus.
Figure 13:
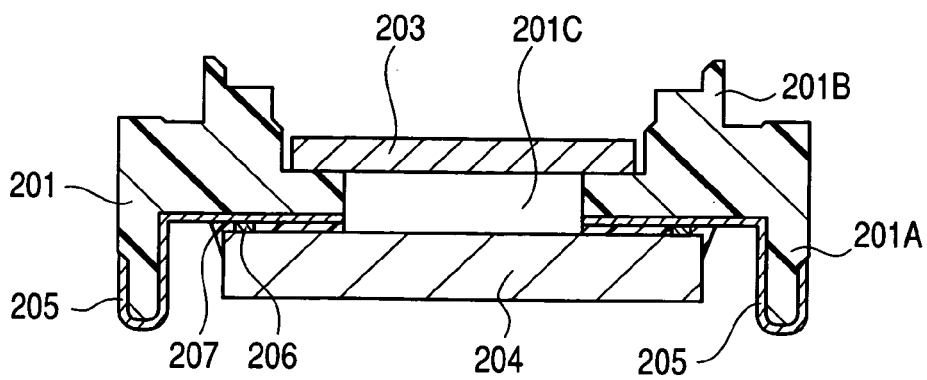
FIG. 13 is a view showing main portions of the conventional solid-state imaging apparatus.
Figure 14A:
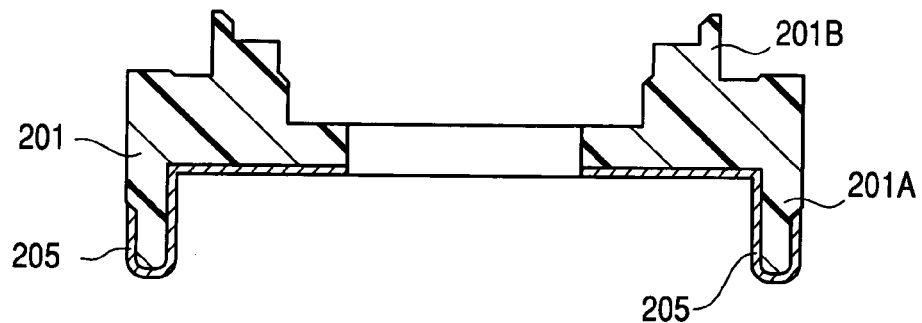
FIGS. 14A to 14C are views showing main portions of steps of mounting the solid-state imaging apparatus of the conventional art example.
Figure 14B:
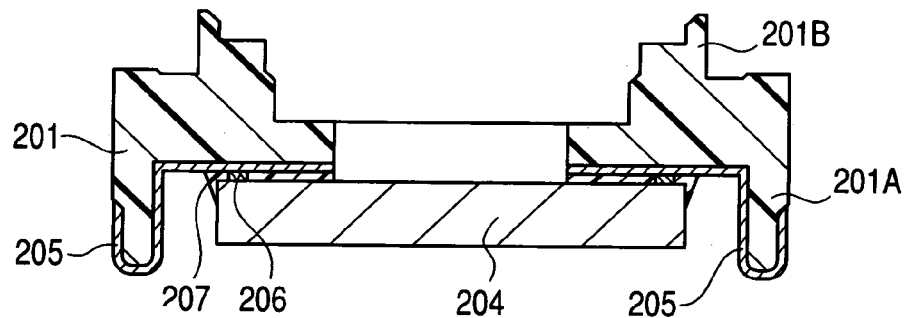
Figure 14C:
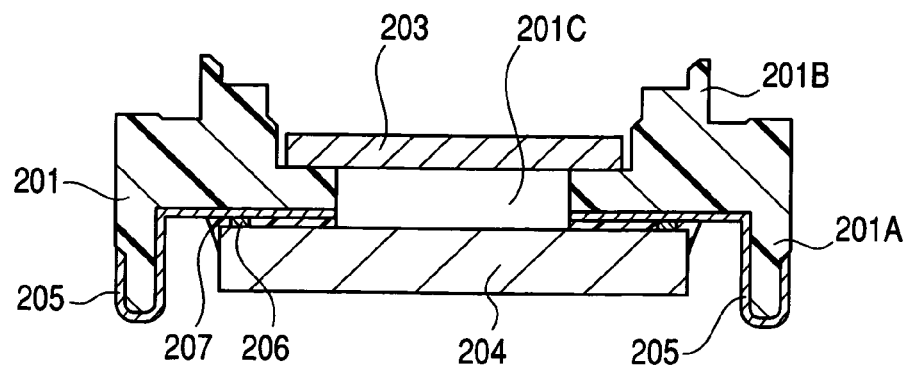

FIGS. 9 and 10 are views showing main portions of a solid-state imaging apparatus according to a fourth embodiment of the invention.

In the third embodiment, terminals for external connection are realized by the terminal pattern formed on the leg portion 101A of the structure member 101. In contrast, according to the fourth embodiment, the film carrier 120F is elongated together with the wiring pattern to the outside of the structure member, so that it can be connected as it is to external components.

According to the configuration, the apparatus can be attached as it is to a foldable portable telephone or the like, so that miniaturization can be attained in a large degree.

In the manufacturing process, it is required simply to prolong the film carrier. The apparatus of this embodiment can be produced in a similar manner as the third embodiment shown in FIGS. 8A to 8D.

In the embodiment described above, the optical filter 103 is attached to the structure member 101. Alternatively, the ceramic substrate 102g constituting the fixing member may be made of light-transmitting ceramic, and a desired film is formed on the surface as a multi-refraction material 20S used as an optical filter, as described in the second embodiment of the invention.

In the embodiment, in order to discharge an internal gas generated during the process of mounting the solid-state image pickup element, a penetrated hole communicating with the through-opening portion 1C is preferably formed in the center area which will be used as an optical filter. The other portions are formed in the same manner as those of the third embodiment.

In the manufacturing process, not only the optical filters but also structure members may be integrally molded, and the molded product may be finally diced along dicing lines d1, d2, d3, . . . , c1, c2, c3, . . . as shown in FIG. 5, thereby obtaining the solid-state imaging apparatus shown in FIG. 6.

Although an optical filter is used as the light-transmitting member in the first to fourth embodiments, the light-transmitting member is not restricted to an optical filter. A light-transmitting sealing member, a lens, or the like may be adequately used as the light-transmitting member.

As the resin constituting the structure member, a thermosetting resin such as an epoxy resin may be used in place of a thermoplastic resin such as a polyphthalamide resin or a PPS resin.

The application of the solid-state imaging apparatus of the invention is not restricted to a camera used in an optical communication field, and the solid-state imaging apparatus can be applied to various optical devices such as a reading device for a CD or a DVD, a reading device for a copier, a medical equipment, and a door phone.

As described above, according to the invention, the fixing member in which less thermal deformation is produced is sealed together with the circuit portion formed on the flexible substrate, into a peripheral portion by using the thickness of an optical space between the portion to which the solid-state image pickup element is attached, and that to which the light-transmitting member is attached. Therefore, the number of external components can be largely reduced. As a result, the invention can provide a solid-state imaging apparatus of a small size.

Since the circuit portion is molded integrally with the structure member, thermal deformation of the structure member which occurs during a process of attaching the solid-state image pickup element can be greatly reduced. As a result, the invention can provide a method of manufacturing a solid-state imaging apparatus in which connection failures are largely decreased.

What is claimed is:

1. A solid-state imaging apparatus comprising:
   a structure member configured by an insulating resin, and which has a through-opening portion;
   a solid-state image pickup element attached to said structure member;
   a light-transmitting member attached to said structure member to cover the through-opening portion and being separated from said solid-state image pickup element by a predetermined distance; and
   a fixing member sealed integrally into said structure member and disposed between a portion where said image pickup element is attached and a portion where said light-transmitting member is attached;
   wherein said fixing member is a circuit board configured by a multilayer wiring portion,
   wherein the multilayer wiring portion is formed in an annular shape on a surface of a light-transmitting substrate, and
   wherein a region positioned in a center area of said light-transmitting substrate and exposed from said multilayer wiring portion comprises an optical filter.

2. The solid-state imaging apparatus according to claim 1, further comprising:
   a flexible substrate bonded to the fixing member; and
   a circuit portion formed on a surface of said flexible substrate and including desired function elements mounted therein,
   wherein said flexible substrate and said circuit portion are integrally sealed into said structure member, and disposed between a portion where said structure member to which said solid-state image pickup element is attached and where said structure member to which said light-transmitting member is attached,
   wherein said fixing member is smaller in coefficient of thermal expansion than the insulating resin.

3. The solid-state imaging apparatus according to claim 2, wherein said circuit portion has a multilayer wiring structure having a conductor pattern, and a part of said he circuit portion is exposed from a portion of said structure member to which said solid-state image pickup element is attached,
   wherein said solid-state image pickup element is disposed in a face-down manner and directly connected to said conductor pattern of said circuit portion.

4. The solid-state imaging apparatus according to claim 2, further comprising a signal processing circuit which processes an output signal of said solid-state image pickup element.

5. The solid-state imaging apparatus according to claim 4, wherein said fixing member is an annular ceramic substrate having an opening in a region corresponding to said through-opening portion,
   wherein said signal processing circuit is a chip component which is connected to said circuit portion.

6. The solid-state imaging apparatus according to claim 5, wherein said signal processing circuit is connected to a first face of said circuit portion, the first face being on a side where said light-transmitting member is attached, and connected to said circuit portion via through-holes formed in said fixing member.

7. The solid-state imaging apparatus according to claim 2, wherein said circuit portion is configured by a multilayer wiring structure member,
   wherein a conductor pattern is exposed on a side of a face on which said solid-state image pickup element is mounted,
   wherein said solid-state image pickup element is directly connected to said conductor pattern.

8. The solid-state imaging apparatus according to claim 7, wherein said structure member has a leg portion on which a wiring portion is to be formed, and a cylindrical body portion which is disposed on said leg portion, and the through-opening portion is formed between said body portion and said leg portion.

9. The solid-state imaging apparatus according to claim 7, wherein the multilayer wiring structure member is electrically connected to a conductor pattern formed in a part of a surface of said leg portion.

10. The solid-state imaging apparatus according to claim 1, wherein said flexible substrate has an extended portion having a conductor terminal pattern which elongates toward an outside of said structure member, and the conductor terminal pattern constitutes power source and output terminals for a signal processing circuit.

* * * * *